United States Patent
Nozawa

(10) Patent No.: US 9,831,463 B2
(45) Date of Patent: Nov. 28, 2017

(54) ELECTRO-OPTIC APPARATUS, METHOD OF MANUFACTURING ELECTRO-OPTIC APPARATUS, AND ELECTRONIC APPARATUS

(71) Applicant: SEIKO EPSON CORPORATION, Tokyo (JP)

(72) Inventor: Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/291,932

(22) Filed: May 30, 2014

(65) Prior Publication Data

US 2014/0361273 A1 Dec. 11, 2014

(30) Foreign Application Priority Data

Jun. 5, 2013 (JP) ................. 2013-118566

(51) Int. Cl.
*H01L 51/52* (2006.01)
*H01L 27/32* (2006.01)

(52) U.S. Cl.
CPC ........ *H01L 51/524* (2013.01); *H01L 27/3276* (2013.01); *H01L 51/5246* (2013.01)

(58) Field of Classification Search
CPC ... H01L 21/48; H01L 21/50; H01L 21/67126; H01L 21/67376; H01L 23/02; H01L 23/10; H01L 23/3142; H01L 24/00; H01L 25/00; H01L 51/524; H01L 2224/83951; H01L 2924/163; H01L 2924/173; H01L 2924/183; H01L 27/32–27/326; H01L 51/50–51/501; H01L 51/05
See application file for complete search history.

(56) References Cited

U.S. PATENT DOCUMENTS

| 6,175,394 | B1* | 1/2001 | Wu .................. G02F 1/136204 257/360 |
| 6,313,900 | B1* | 11/2001 | Kawata ............ G02F 1/136277 349/153 |
| 2003/0164674 | A1 | 9/2003 | Imamura |
| 2004/0121571 | A1* | 6/2004 | Uchikoshi ......... H01L 21/76801 438/586 |
| 2004/0195965 | A1* | 10/2004 | Yamazaki ........... H01L 51/5016 313/506 |
| 2005/0146266 | A1* | 7/2005 | Kuma ................ H01L 27/322 313/506 |
| 2006/0088951 | A1 | 4/2006 | Hayashi et al. |
| 2007/0007870 | A1* | 1/2007 | Yamazaki ........... H01L 51/0025 313/112 |
| 2007/0177069 | A1* | 8/2007 | Lee .................... H01L 51/5246 349/56 |

(Continued)

FOREIGN PATENT DOCUMENTS

| JP | A-2000-66241 | 3/2000 |
| JP | A-2006-147528 | 6/2006 |

(Continued)

*Primary Examiner* — Cuong B Nguyen
*Assistant Examiner* — Samuel Park
(74) *Attorney, Agent, or Firm* — Oliff PLC

(57) ABSTRACT

There is provided an organic EL apparatus as an electro-optic apparatus including: a substrate; a light-emitting element that is provided at a first area of the substrate; a guard line that is provided to surround the first area; and a sealing film or a sealing structure that covers the first area and reaches the guard line.

17 Claims, 11 Drawing Sheets

(56) References Cited

U.S. PATENT DOCUMENTS

| | | | |
|---|---|---|---|
| 2007/0295962 A1* | 12/2007 | Choi | H01L 27/1214 |
| | | | 257/59 |
| 2008/0204618 A1 | 8/2008 | Jung et al. | |
| 2010/0067235 A1* | 3/2010 | Yamashita | G02F 1/133305 |
| | | | 362/293 |
| 2010/0265024 A1 | 10/2010 | Nakashiba | |
| 2010/0295759 A1 | 11/2010 | Tanaka | |
| 2010/0320909 A1 | 12/2010 | Izumi | |
| 2011/0316007 A1* | 12/2011 | Sagawa | H01L 27/3246 |
| | | | 257/88 |
| 2013/0001742 A1 | 1/2013 | Nakashiba | |
| 2014/0151904 A1 | 6/2014 | Nakashiba | |
| 2014/0353637 A1* | 12/2014 | Kawata | H01L 27/3272 |
| | | | 257/40 |
| 2014/0353638 A1* | 12/2014 | Kawata | H01L 27/322 |
| | | | 257/40 |
| 2015/0035116 A1 | 2/2015 | Nakashiba | |
| 2016/0043122 A1* | 2/2016 | Fujimori | H01L 27/14618 |
| | | | 257/433 |

FOREIGN PATENT DOCUMENTS

| | | |
|---|---|---|
| JP | A-2008-203856 | 9/2008 |
| JP | A-2009-181094 | 8/2009 |
| JP | A-2009-181095 | 8/2009 |
| JP | 2010-251662 A | 11/2010 |
| JP | A-2010-272270 | 12/2010 |
| JP | A-2011-8969 | 1/2011 |
| JP | A-2011-146323 | 7/2011 |
| JP | A-2011-233543 | 11/2011 |
| JP | 2012-155987 A | 8/2012 |
| JP | A-2012-253036 | 12/2012 |

* cited by examiner

ELECTRO-OPTIC APPARATUS, METHOD OF MANUFACTURING ELECTRO-OPTIC APPARATUS, AND ELECTRONIC APPARATUS

BACKGROUND

1. Technical Field

The present invention relates to an electro-optic apparatus, a method of manufacturing the electro-optic apparatus, and an electronic apparatus which includes the electro-optic apparatus.

2. Related Art

As an electro-optic apparatus, an organic EL apparatus is known that includes an organic electroluminescence element (hereinafter, referred to as an organic EL element) having an anode, a cathode, and a functional layer which is arranged between the anode and the cathode and the functional layer includes a functional layer.

The organic EL element loses a light emitting function when moisture or the like enters the functional layer from the outside. Therefore, the electro-optic apparatus which includes the organic EL element uses a structure in which the organic EL element is sealed such that moisture or the like does not enter the organic EL element.

For example, JP-A-2006-147528 discloses a method of manufacturing an organic EL apparatus, the method including a process to form a buffer layer that covers a second electrode which functions as a cathode, and a process to form a gas barrier layer that covers the buffer layer. Further, JP-A-2006-147528 discloses a method of forming the buffer layer after forming an electrode protective layer that covers the second electrode.

According to the method of manufacturing the organic EL apparatus, the buffer layer is formed between the inorganic film and the organic EL element. Therefore, it is possible to prevent cracks or peeling of the gas barrier layer from being generated due to stress, such as heat or pressure, and thus it is possible to implement a sealing structure that has an excellent gas barrier property, compared to a case in which the organic EL element is directly covered by the gas barrier layer.

However, even though the sealing structure disclosed in JP-A-2006-147528 is used when an organic EL apparatus is actually manufactured, there may be a problem in that moisture or the like enters from a edge of the substrate and the light emitting function of the organic EL element may be lost. More specifically, in a case of a small-sized organic EL apparatus, it is difficult to sufficiently secure a distance from the edge of the substrate to the organic EL element, and thus the sealing structure needs improving compared to a large-sized organic EL apparatus.

SUMMARY

The invention can be realized in the following forms or application examples.

First Application Example

According to this application example, there is provided an electro-optic apparatus including: a substrate; a light-emitting element that is provided at a first area of the substrate; a guard line that is provided to surround the first area; and a sealing film or a sealing structure that covers the first area and reaches the guard line.

In this configuration, not only the light-emitting element is sealed by the sealing film or the sealing structure but also it is possible to prevent the light emitting function of the light-emitting element from being deteriorated or lost due to moisture or the like, which enters from the end surface side of the substrate, using the guard line. Therefore, it is possible to provide an electro-optic apparatus that includes a light-emitting element which has a high reliability and quality for the light emitting function.

In the electro-optic apparatus according to the application example, the sealing film or the sealing structure may be provided to reach the guard line in at least one edge of the substrate.

In this configuration, the sealing film or the sealing structure is provided to reach the guard line in at least one edge of the substrate. Therefore, it is possible to improve the reliability and quality for the light emitting function, compared to a case in which the guard line is not present.

In the electro-optic apparatus according to the application example, the substrate may include a first edge provided with connection terminals, and the sealing film or the sealing structure may be provided to reach the guard line in edges except for the first edge.

In the electro-optic apparatus according to the application example, the sealing film or the sealing structure may be provided to reach the guard line in four edges of the substrate.

In this configuration, it is possible to provide the electro-optic apparatus that includes the light-emitting element which has higher reliability and quality for the light emitting function.

The electro-optic apparatus according to the application example may further include a plurality of wiring layers that are provided above the substrate and the guard line may include wirings that are respectively provided on at least two wiring layers of the plurality of wiring layers.

In this configuration, since the guard line is provided throughout at least two wiring layers of the plurality of wiring layers of the substrate, it is possible to prevent moisture or the like from entering from the end surface side of the substrate in regard to at least two wiring layers.

In the electro-optic apparatus according to the application example, the substrate may be a semiconductor substrate, and the guard line may be electrically connected to the semiconductor substrate.

In this configuration, since the guard line is provided over the plurality of wiring layers from the semiconductor substrate, it is possible to prevent moisture or the like from entering from the end surface side of the semiconductor substrate.

In the electro-optic apparatus according to the application example, a predetermined potential may be supplied to the guard line.

In this configuration, the guard line may function as a unit which improves the sealing function for the light-emitting element, and may function as a shield which prevents electrical noise from being propagated to the inside of the electro-optic apparatus from the outside.

In the electro-optic apparatus according to the application example, the sealing structure may include a sealing member that is adhered to the substrate so as to have a space between the sealing structure and the light-emitting element.

In this configuration, it is possible to provide an electro-optic apparatus that includes a so-called can sealing structure.

In the electro-optic apparatus according to the application example, the sealing structure may include a sealing substrate that is adhered to the substrate so as to seal the light-emitting element.

In the electro-optic apparatus according to the application example, the light-emitting element may be an organic electroluminescence element.

In this configuration, it is possible to provide the electro-optic apparatus that includes the organic electroluminescence element which has higher reliability and quality for the light emitting function.

Second Application Example

According to this application example, there is provided a method of manufacturing the first area, an electro-optic apparatus that includes a light-emitting element which is provided at a first area of the substrate, and a sealing film or a sealing structure which seals the light-emitting element, the method including: forming a guard line so as to surround the first area; and forming the sealing film or the sealing structure so as to covering the first area and to reach the guard line.

In the method of manufacturing an electro-optic apparatus, it is possible to manufacture the electro-optic apparatus that includes the light-emitting element which has higher reliability and quality for a light emitting function.

Third Application Example

According to this application example, there is provided an electronic apparatus which includes the electro-optic apparatus according to the first application example.

In this configuration, it is possible to provide the electronic apparatus that has higher reliability and quality for a light emitting function.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments in which the invention is embodied will be described with reference to the accompanying drawings. Meanwhile, the attached drawings are shown by being appropriately enlarged or reduced such that portions to be explained can be recognized.

Meanwhile, in embodiments below, for example, a case in which "on a substrate" is written includes a case of being arranged so as to come into contact with the substrate, a case of being arranged on the substrate through another component, or a case of being arranged such that a part comes into contact with the substrate and another part is arranged through another component.

First Embodiment

Electro-Optic Apparatus

First, as an example of an electro-optic apparatus according to this embodiment, an organic electroluminescence apparatus (hereinafter, referred to as an organic EL apparatus) is provided and described with reference to FIGS. 1 to 5.

Figure 1:
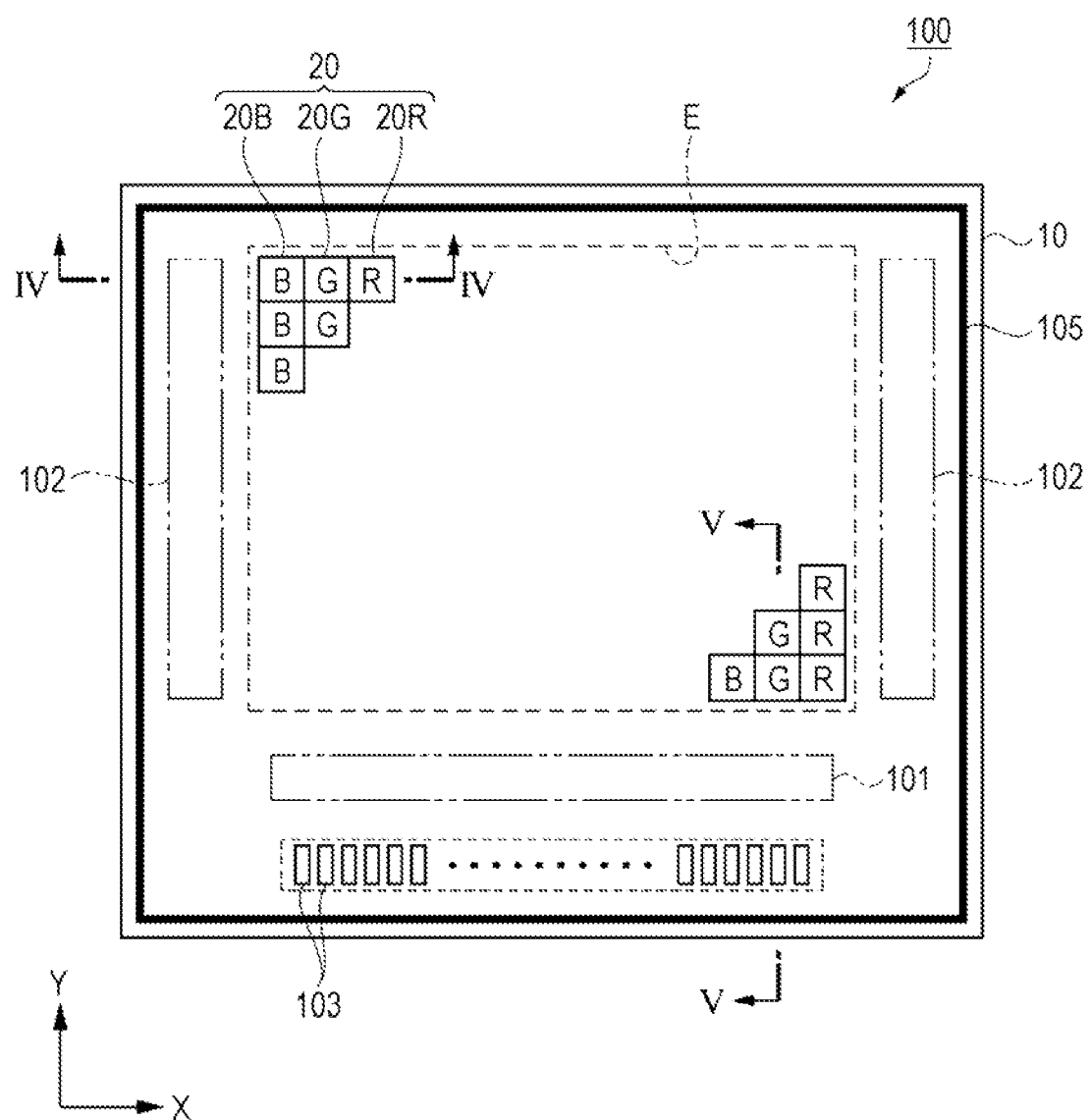
FIG. 1 is a schematic plan view illustrating the configuration of an organic EL apparatus as an electro-optic apparatus according to a first embodiment.
Figure 2:
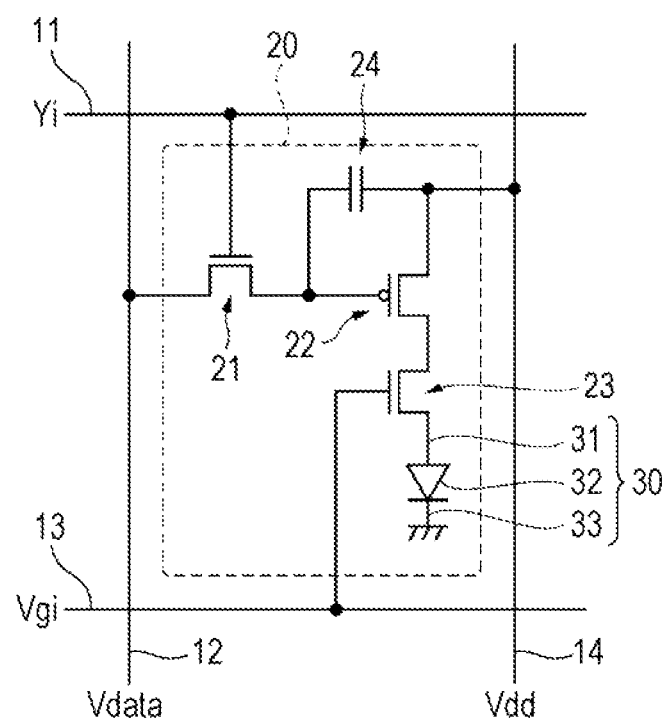
FIG. 2 is an equivalent circuit diagram illustrating the electrical configuration of a light emitting pixel.

FIG. 1 is a schematic plan view illustrating the configuration of an organic EL apparatus as an electro-optic apparatus according to a first embodiment, FIG. 2 is an equivalent circuit diagram illustrating the electrical configuration of a light emitting pixel.

As shown in FIG. 1, an organic EL apparatus 100 as the electro-optic apparatus according to the embodiment includes an element substrate 10 as a substrate, a plurality of light emitting pixels 20 that are arranged in a matrix shape in a display area E as a first area of the element substrate 10, a data line drive circuit 101 and scan line drive circuits 102 that are peripheral circuits which controls the drive of the plurality of light emitting pixels 20, and a plurality of external connection terminals 103 for electrical connection with external circuits. In addition, the organic EL apparatus 100 further includes a guard line 105 that is arranged in a frame shape along the periphery of the element substrate 10 so as to surround the above configurations.

The light emitting pixels 20 include a light emitting pixel 20B that can obtain light emission of a blue color (B), a light emitting pixel 20G that can obtain light emission of a green color (G), and a light emitting pixel 20R that can obtain light emission of a red color (R). In addition, light emitting pixels 20 that can obtain light emission of the same color are arranged in the vertical direction in the drawing, and light emitting pixels 20 which can obtain light emission of different colors are repeatedly arranged in the horizontal direction in the drawing in order of B, G, and R. The arrangement of the light emitting pixels 20 is called a stripe system but the invention is not limited thereto. For example, the arrangement of the light emitting pixels 20 which can obtain light emission of different colors in the horizontal direction may not be in order of B, G and R, and, for example, in order of R, G, and B.

Hereinafter, description will be made in such a way that the vertical direction in which the light emitting pixels 20 that can obtain light emission of the same color are arranged is a Y direction, and a direction which is perpendicular to the Y direction is an X direction.

Although the detailed configuration of the light emitting pixel 20 will be described later, each of the light emitting pixels 20B, 20G, and 20R in the embodiment includes an organic electroluminescence element (hereinafter, referred to as an organic EL element) as a light-emitting element and a color filter corresponding to E, G, or R, and converts light emission from the organic EL element into a luminescence color of B, G, or R, thereby enabling full color display. In addition, an optical resonance structure which improves the luminance of a predetermined wavelength in the range of light emitting wavelength from the organic EL element is constructed for each of the light emitting pixels 20B, 20G, and 20R.

In the organic EL apparatus 100, the light emitting pixels 20B, 20G, and 20R function as sub pixels, and one pixel unit for image display is configured to include the three light emitting pixels 20B, 20G, and 20R which can obtain light emission corresponding to B, G, and R. Meanwhile, the configuration of the pixel unit is not limited thereto, and a light emitting pixel which can obtain luminescence color (including a white color) other than B, G, and R may be included in the pixel unit.

The plurality of external connection terminals 103 are arranged in the X direction and provided along the first edge part of the element substrate 10. In addition, the data line drive circuit 101 is arranged between the external connection terminals 103 and the display area E in the Y direction, and the data line drive circuit 101 is extended in the X direction. In addition, a pair of scan line drive circuits 102 is provided to face each other while interposing the display area E therebetween in the X direction. In addition, the scan line drive circuits 102 are arranged between the guard line 105 and the display area E along a second edge part which is perpendicular to the first edge part, and is extended in the Y direction.

As described above, in the display area E, the plurality of light emitting pixels 20 are provided in a matrix shape, and a scan line 11, a data line 12, a lighting control line 13, and a power line 14 are provided as signal, lines corresponding to a light emitting pixel 20 in the element substrate 10, as shown in FIG. 2.

In the embodiment, the scan line 11 and the lighting control line 13 are extended in the X direction in parallel, and the data line 12 and the power line 14 are extended in the Y direction in parallel.

In the display area E, a plurality of scan lines 11 and a plurality of lighting control lines 13 are provided to correspond to M rows of the plurality of light emitting pixels 20 which are arranged in the matrix shape, and are connected to each of the pair of scan line drive circuits 102 shown in FIG. 1. In addition, a plurality of data lines 12 and a plurality of power lines 14 are provided to correspond to N columns of the plurality of light emitting pixels 20 which are arranged in the matrix shape, and the plurality of data lines 12 are connected to the data line drive circuit 101 shown in FIG. 1, and the plurality of power lines 14 are connected to any of the plurality of external connection terminals 103.

In the vicinity of the intersection of the scan line 11 and the data line 12, a first transistor 21, second transistor 22, third transistor 23, a storage capacitor 24, and an organic EL element 30, which is a light-emitting element, are provided to constitute the pixel circuit of the light emitting pixel 20.

The organic EL element 30 includes a pixel electrode 31 which is the anode, a counter electrode 33 which is the cathode, and a functional layer 32 which is interposed between the electrodes and includes a light emitting layer. The counter electrode 33 is an electrode which is commonly provided over the plurality of light emitting pixels 20. For example, a low-order reference potential Vss or a potential GND is supplied to a power supply voltage Vdd which is supplied to the power line 14.

The first transistor 21 and the third transistor 23 are, for example, n-channel type transistors. The second transistor 22 is, for example, a p-channel type transistor.

The first transistor 21 includes a gate electrode which is connected to the scan line 11, one side-current end which is connected to the data line 12, and the other side-current end which is connected to a gate electrode of the second transistor 22 and one side-electrode of the storage capacitor 24.

The second transistor 22 includes one side-current end which is connected to the power line 14 and the other side-electrode of the storage capacitor 24. The second transistor 22 includes the other side-current end which is connected to one side-current end of the third transistor 23. In other words, the second transistor 22 and the third transistor 23 share one current end of the pair of current ends.

The third transistor 23 includes a gate electrode which is connected to the lighting control line 13 and the other side-current end which is connected to the pixel electrode 31 of the organic EL element 30.

Here, the pair of current ends of each of the first transistor 21, the second transistor 22, and the third transistor 23 include one side which is a source and the other end which is a drain.

In such a pixel circuit, if the voltage level of a scan signal Yi which is supplied from the scan line drive circuit 102 to the scan line 11 becomes a Hi level, the n-channel type first transistor 21 becomes an ON state (ON), the data line 12 is electrically connected to the storage capacitor 24 through the first transistor 21 which is in the ON state. Further, if a data signal is supplied from the data line drive circuit 101 to the data line 12, a potential difference between the voltage level. Vdata of the data signal and a power supply voltage Vdd which is supplied to the power line 14 is stored in the storage capacitor 24.

If the voltage level of the scan signal Yi which is supplied from the scan line drive circuit 102 to the scan line 11 becomes a Low level, the n-channel type first transistor 21 becomes an OFF state (OFF), and a voltage Vgs between the gate and the source of the second transistor 22 is maintained as a voltage acquired when the voltage level Vdata is supplied. In addition, after the scan signal Yi becomes the Low level, the voltage level of a lighting control signal Vgi which is supplied to the lighting control line 13 becomes a Hi level, and the third transistor 23 becomes the ON state (ON). If so, current based on the voltage Vgs between the gate and the source of the second transistor 22 flows between the source and the drain of the second transistor 22. More specifically, the current flows through a path which reaches the organic EL element 30 from the power line 14 through the second transistor 22 and the third transistor 23.

The organic EL element 30 emits light based on the level of the current which flows through the organic EL element 30. The current which flows through the organic EL element 30 is determined by a work point between the second transistor 22 and the organic EL element 30, which is set based on the voltage Vgs between the gate and the source of the second transistor 22. The voltage Vgs between the gate and the source of the second transistor 22 is a voltage which is maintained in the storage capacitor 24 due to the potential difference between the voltage level Vdata of the data line 12 and the power supply voltage Vdd when the scan signal Yi is at the Hi level. In this way, the light emission luminance of the light emitting pixel 20 is defined based on the voltage level Vdata of the data signal and the length of a period during which the third transistor 23 is at the ON state. Here, it is possible to supply gradation of luminance according to the image information of the light emitting pixel 20 based on the value of the voltage level Vdata of the data signal, thereby enabling full color display.

Meanwhile, in the embodiment, the invention is not limited to the pixel circuit of the light emitting pixel 20, which includes three transistors 21, 22, and 23, and may include a configuration which includes a switching transistor and a driving transistor. In addition, a transistor which constitutes the pixel circuit may include an n-channel type transistor, a p-channel type transistor, or both the n-channel type transistor and the p-channel type transistor. In addition, the transistor which constitutes the pixel circuit of the light emitting pixel 20 may include an MOS-type transistor which has an active layer on a semiconductor substrate, a thin-film transistor, and an electric field effect transistor.

In addition, the arrangement of the lighting control line 13 and the power line 14 which are signal lines other than the scan line 11 and the data line 12 is influenced by the arrangement of the transistors or the storage capacitor 24, and is not limited thereto.

In the embodiment, as a transistor which constitutes the pixel circuit of the light emitting pixel 20, an example in which an MOS-type transistor having an active layer on the semiconductor substrate is used will be described below.

Figure 3:
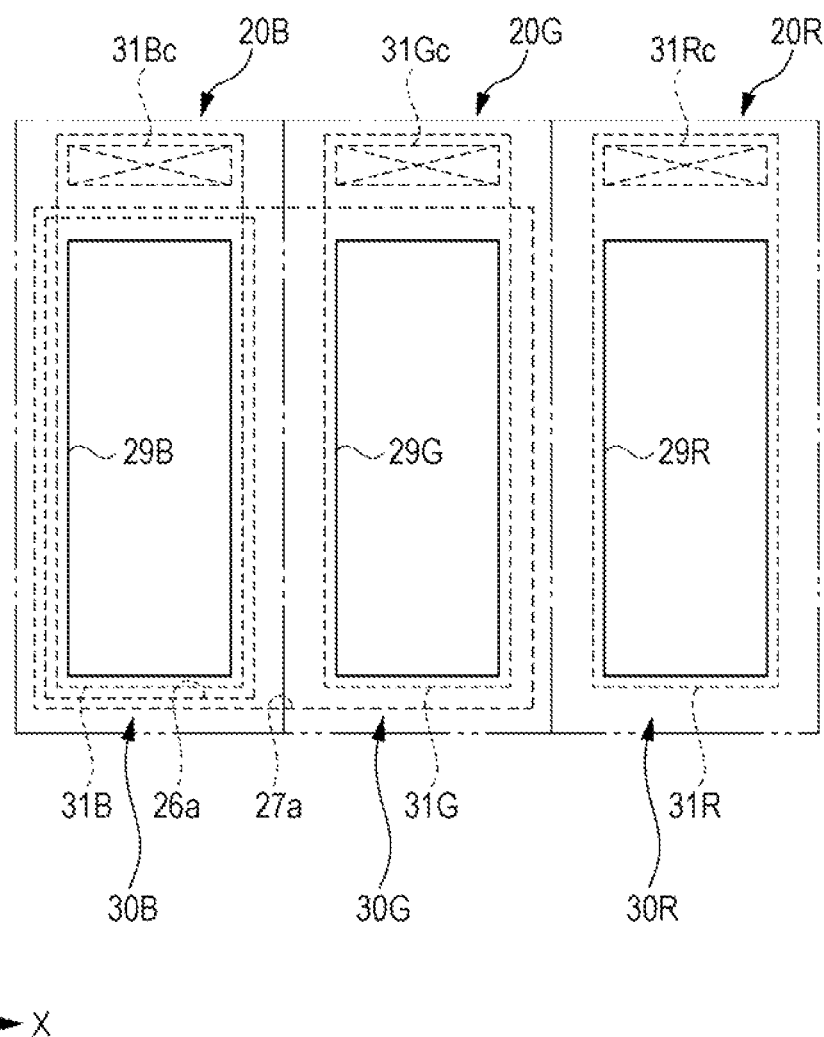
FIG. 3 is a schematic plan view illustrating the arrangement of light emitting pixels.
Figure 4:
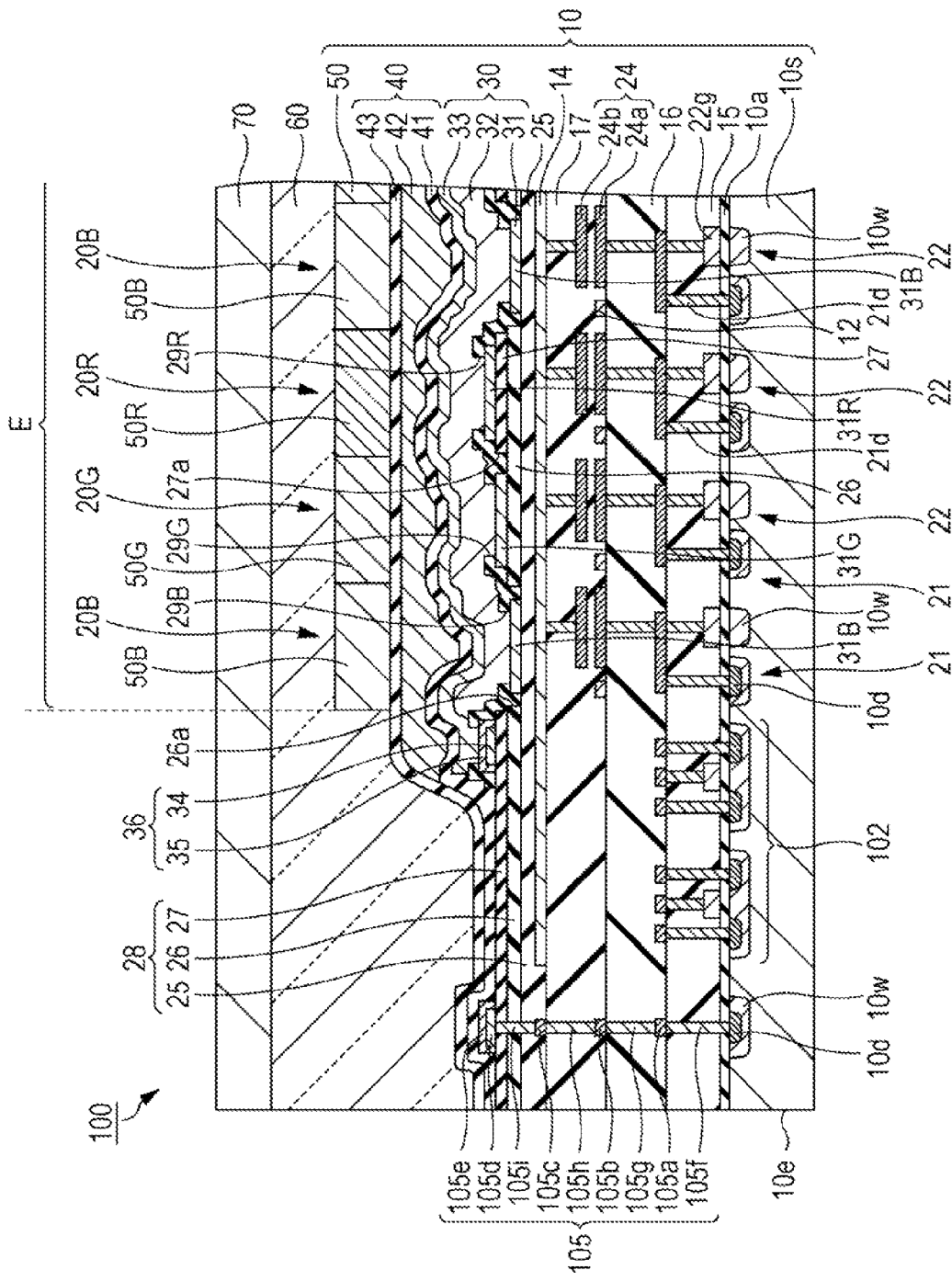
FIG. 4 is a schematic cross-sectional view illustrating the structures of the light emitting pixels and a guard line taken along a line IV-IV in FIG. 1.
Figure 5:
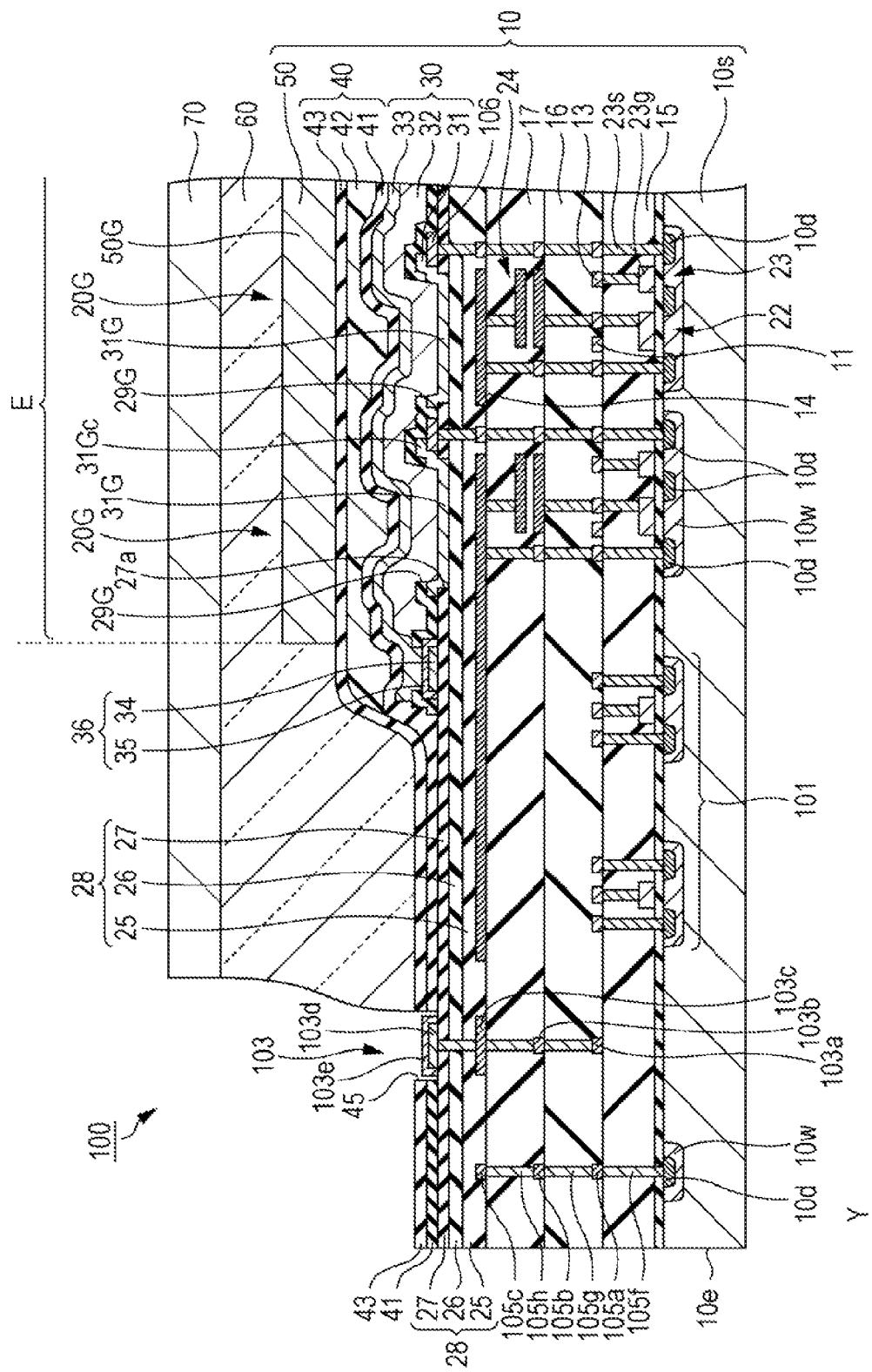
FIG. 5 is a schematic cross-sectional view illustrating the structures of the light emitting pixels and the guard line taken along a line V-V in FIG. 1.

The detailed configuration and structure of the light emitting pixel 20 will be described with reference to FIGS. 3 to 5. FIG. 3 is a schematic plan view illustrating the arrangement of the light emitting pixel, FIG. 4 is a schematic cross-sectional view illustrating the structures of the light emitting pixels and the guard line taken along a line IV-IV in FIG. 1, and FIG. 5 is a schematic cross-sectional view illustrating the structures of the light emitting pixels and the guard line taken along a line V-V in FIG. 1. Meanwhile, in FIG. 4, the first transistor 21, wirings which relate to the first transistor 21, and the like in the pixel circuit are shown, and the second transistor 22 and the third transistor 23 are not shown. In FIG. 5, the second transistor 22, the third transistor 23, wirings which relate to the second transistor 22 and the third transistor 23, and the like in the pixel circuit are shown, and the first transistor 21 is not shown.

As shown in FIG. 3, each of the light emitting pixels 20B, 20G, and 20R has a rectangular shape in a planar view, and the longitudinal direction thereof is arranged along the Y direction. Each of the light emitting pixels 20B, 20G, and 20R is provided with an organic EL element 30 which is an equivalent circuit shown in FIG. 2. In order to discriminate between the organic EL elements 30 which are provided for the respective light emitting pixels 20B, 20G, and 20R, description will be made using organic EL elements 30B, 30G, and 30R. In addition, in order to discriminate the pixel electrodes 31 of the organic EL elements 30 for the respective light emitting pixels 20B, 20G, and 20R, description will be made using pixel electrode 31B, 31G, and 31R.

The light emitting pixel 20B is provided with the pixel electrode 31B and a contact part 31Bc which electrically connects the pixel electrode 31B to the third transistor 23. In the same manner, the light emitting pixel 20G is provided with the pixel electrode 31G and a contact part 31Gc which electrically connects the pixel electrode 31G to the third transistor 23. The light emitting pixel 20R is provided with the pixel electrode 31R and a contact part 31Rc which electrically connect the pixel electrode 31R to the third transistor 23.

Each of the pixel electrodes 31B, 31G, and 31R has a rectangular shape in a planar view, and each of the contact parts 31Bc, 31Gc, and 31Rc is arranged on the upper side thereof in the longitudinal direction.

The respective light emitting pixels 20B, 20G, and 20R have insulation structures formed with openings 29B, 29G, and 29R that electrically insulate adjacent pixel electrodes 31 and define areas that come into contact with a functional layer 32 on the pixel electrodes 31B, 31G, and 31R.

As shown in FIG. 4, the organic EL apparatus 100 includes the element substrate 10 in which the light emitting pixels 20B, 20G, and 20R, a color filter 50, and the like are formed, and a transparent sealing substrate 70. The element substrate 10 and the sealing substrate 70 are bonded together by a resin layer 60 which has adhesiveness and transparency. The color filter 50 includes filter layers 50B, 50G, and 50R which correspond to the respective B, G, and R colors. Each of the filter layers 50B, 50G, and 50R is arranged to correspond to each of the light emitting pixels 20B, 20G, and 20R in the element substrate 10. Light which is emitted from the functional layer 32 is transmitted through any one of the corresponding filter layers 50B, 50G, and 50R and discharged from the side of the sealing substrate 70. That is, the organic EL apparatus 100 has a top emission structure.

Because the organic EL apparatus 100 has the top emission structure, it is possible to use an opaque ceramic substrate or a semiconductor substrate as the base material 10s of the element substrate 10 in addition to a transparent glass substrate.

In the embodiment, a semiconductor substrate is used as the base material 10s. The semiconductor substrate is, for example, a silicon substrate.

The base material 10s is provided with a well part 10w which is formed by injecting ions into the semiconductor substrate, and an ion implantation part 10d which is formed by injecting ions, which are different from the ions injected into the well part 10w, into the well part 10w. The well part 10w functions as the channel of the transistor in the light emitting pixel 20, and the ion implantation part 10d function as the source and the drain of the transistor or the part of the wiring in the light emitting pixel 20.

An insulation film 10a is formed to cover the surface of the base material 10s in which the ion implantation part 10d and the well part 10w are formed. The insulation film 10a functions as a gate insulation film. For example, a conductive film, such as poly silicon, is formed on the insulation film 10a, and the gate electrode 22g of the second transistor 22 is formed by patterning the conductive film. The gate electrode 22g is arranged to face the well part 10w which function as the channel of the second transistor 22. The gate electrodes of the first transistor 21 and the third transistor 23 are arranged using the conductive film in the same manner.

A first interlayer insulation film 15 is formed to cover the gate electrode 22g. Further, a contact hole is formed to penetrate through the first interlayer insulation film 15 and to reach, for example, the gate, the source, and the drain of the first transistor 21 and the gate electrode 22g of the second transistor 22. The conductive film is formed to coat at least the inside of the contact hole, and to cover the surface of the first interlayer insulation film 15. For example, the drain electrode 21d of the first transistor 21, a wiring which connects drain electrode 21d to the gate electrode 22g of the second transistor 22, and the like are formed by patterning the conductive film.

A second interlayer insulation film 16 is formed to cover various wirings on the first interlayer insulation film 15. Further, a contact hole is formed to penetrate through the second interlayer insulation film 16 and to reach a wiring which is formed on the first interlayer insulation film 15. A conductive film is formed to coat at least the inside of the contact hole, and to cover the surface of the second interlayer insulation film 16. For example, the one-side electrode 24*a* of the storage capacitor 24 and the data line 12 are formed by patterning the conductive film. Therefore, the one-side electrode 24*a* of the storage capacitor 24 is connected to the wiring which is formed on the first interlayer insulation film 15 through the contact hole. That is, the one-side electrode 24*a* is electrically connected to the gate electrodes 22*g* of the second transistors 22.

Subsequently, a dielectric layer (which is not shown in FIG. 4) is formed to cover at least the one-side electrode 24*a*. In addition, the other-side electrode 24*b* of the storage capacitor 24 is formed in a position which faces the one-side electrode 24*a* while interposing the dielectric layer therebetween. Therefore, the storage capacitor 24, which includes the dielectric layer between a pair of electrodes 24*a* and 24*b*, is formed.

A third interlayer insulation film 17 is formed to cover the storage capacitor 24. A contact hole is formed to penetrate through the third interlayer insulation film 17, and to reach, for example, the other-side electrode 24*b* of the storage capacitor 24 and a wiring which is formed on the second interlayer insulation film 16. A conductive film is formed to coat at least the inside of the contact hole, and to cover the surface of the third interlayer insulation film 17. The power line 14 or other wirings are formed by patterning the conductive film. In the embodiment, power line 14 is formed using, for example, a metal, such as Al (aluminum) or Ag (silver), which has light reflectivity and conductivity, or an alloy of the metals. In addition, the power line 14 faces the pixel electrodes 31B, 31G, and 31R except for parts which overlap with the contact parts 31Bc, 31Gc, and 31Rc of the light emitting pixels 20B, 20G, and 20R (refer to FIG. 3), and is formed to constitute a plane throughout the display area E. The parts of the power line 14 which face the pixel electrodes 31B, 31G, and 31R function as a reflection layer.

Meanwhile, a configuration may be made such that the power line 14 is formed of a material which has conductivity, and an additional reflection layer is provided between the power line 14 and the pixel electrodes 31B, 31G, and 31R.

A first insulation film 25 is formed to cover the power line 14. Subsequently, a second insulation film 26 and a third insulation film 27 are formed to overlap with the first insulation film 25. In the embodiment, silicon nitride (SiN) is used as an insulation material which forms the first insulation film 25. Silicon oxide ($SiO_2$) is used as an insulation material which forms the second insulation film 26 and the third insulation film 27. The reason that different insulation materials are used as described above is to provide an etching selection ratio to the first insulation film 25 when the second insulation film 26 and the third insulation film 27 are subsequently patterned.

Subsequently, the third insulation film 27 is partially etched, and thus an opening 27*a*, in which the pixel electrode 31B of the light emitting pixel 20B and the pixel electrode 31G of the light emitting pixel 20G will be arranged later in planar view, is formed as shown in FIG. 3. Further, the second insulation film 26 which is exposed in the opening 27*a* is partially etched, and thus an opening 26*a*, in which the pixel electrode 31B of the light emitting pixel 20B will be arranged later in planar view, is formed as shown in FIG. 3.

Subsequently, a transparent conductive film which covers the third insulation film 27 is formed while the insides of the opening 26*a* and the opening 27*a* are coated, and the transparent conductive film is patterned. Therefore, the pixel electrode 31B is formed in the opening 26*a*, the pixel electrode 31G is formed in the opening 27*a*, and the pixel electrode 31R is formed on the third insulation film 27. The transparent conductive film is, for example, an Indium Tin Oxide (ITO) film or an Indium Zinc Oxide (IZO) film. The thickness of the pixel electrodes 31B, 31G, and 31R is approximately 100 nm. Therefore, the first insulation film 25 is present between the power line 14 and the pixel electrode 31B, the first insulation film 25 and the second insulation film 26 are present between the power line 14 and the pixel electrode 31G, and the first insulation film 25, the second insulation film 26, and the third insulation film 27 are present between the power line 14 and the pixel electrode 31R. Thereafter, regardless of the number of layers of the insulation films which are provided between the power line 14 and the pixel electrode 31, the insulation films are collectively called an insulation film 28.

Subsequently, an insulation film 29 is formed to cover the pixel electrodes 31B, 31G, and 31R. The insulation film 29 is formed using, for example, silicon oxide ($SiO_2$). Further, in order to define an area in which a functional layer 32 which is formed later comes into contact with the pixel electrodes 31B, 31G, and 31R, the insulation film 29 is partially etched, and thus openings 29B, 29G, and 29R, which are open on the pixel electrodes 31B, 31G, and 31R, are formed. The thickness of the insulation film 29 is approximately 60 nm.

Subsequently, the functional layer 32 is formed to fill the openings 29B, 29G, and 29R throughout the display area E in which the pixel electrodes 31B, 31G, and 31R are arranged.

The functional layer 32 includes a light emitting layer in which an organic semiconductor material is used as the light emitting material, and is configured to include, for example, the hole injection layer, the hole transport layer, the light emitting layer, the electron transport layer, the electron injection layer, and the like which are sequentially laminated from the side of the pixel electrode 31. The configuration of the functional layer 32 is not particularly limited and a well-known configuration can be applied. For example, the functional layer 32 may realize white light emission by including light emitting layers in which respective luminescence colors of B (blue), G (green), and R (red) can be obtained or may realize a pseudo white color by including light emitting layers in which B (blue) and orange luminescence colors can be obtained. In addition, for the purpose of improving luminous efficiency or the like, a configuration which includes an intermediate layer that supports or disturbs movement of holes and electrons injected into the light emitting layer as carriers may be provided.

A method of forming each layer which constitutes the functional layer 32 is not particularly limited, and it is possible to use, for example, a vapor-phase process such as a vacuum evaporation method, or a liquid-phase process, such as an ink jet method. Otherwise, the functional layer 32 may be formed by combining both the vapor-phase process and the liquid-phase process.

Subsequently, the counter electrode 33 which is a common cathode is formed to cover the functional layer 32 throughout at least the display area E. In the embodiment, the counter electrode 33 is formed by controlling the thickness using, for example, alloy which includes Ag (MgAg or the like) such that the counter electrode 33 has light reflectivity and light transparency. It is preferable to form the counter electrode 33 using a vapor-phase process, such as a vacuum evaporation method, by taking the damage of the functional layer 32 due to moisture, heat, or the like into consideration. Therefore, the organic EL element 30 is formed for each of the light emitting pixels 20B, 20G, and 20R.

Meanwhile, a cathode wiring 36 is formed on the insulation film 28 to surround the display area E. The cathode wiring 36 is configured to include a wiring 34 which is formed of a metallic material, such as Al, and a conductive protective film 35 which coats the wiring 34. A transparent conductive film is used for the protective film 35 the same as that of the pixel electrodes 31B, 31G, and 31R. In addition, the insulation film 29 is formed to cover the periphery of the cathode wiring 36 such that an opening is present on the cathode wiring 36. The counter electrode 33 is formed to cover the functional layer 32 and to overlap with the cathode wiring 36. The cathode wiring 36 is a wiring which is connected to any one of the plurality of external connection terminals 103 and supplies, for example, potential, such as reference potential Vss or GND, to the counter electrode 33.

Subsequently, a sealing layer 40 is formed to cover a plurality of organic EL element 30 formed in the display area E. In the embodiment, the sealing layer 40 is configured to include a first sealing film 41 which covers the surface of the counter electrode 33, a buffer layer 42, and a second sealing film 43 which covers the buffer layer 42.

The first sealing film 41 is formed using an inorganic compound, such as metal oxide, for example, silicon oxide, silicon nitride, silicon oxide nitride, or titanium nitride, which is hardly permeated by gas (gas barrier property), such as moisture or oxygen, and which can obtain transparency. It is preferable to use the vapor-phase process which can form a dense film at a low temperature as a forming method. For example, it is possible to exemplify a high-density plasma forming method, such as a plasma CVD method or an ECR plasma method, a vacuum evaporation method, and an ion plating method. The thickness of the first sealing film 41 is approximately 200 nm to 400 nm.

The surface of the first sealing film 41 is influenced by a structure such as the organic EL element 30 provided in the lower layer thereof, and thus unevenness is generated thereon. In the embodiment, in order to prevent the deterioration of the sealing function of the second sealing film 43 due to the unevenness or the adhesion of a foreign substance, the buffer layer 42 is formed to smoothen and flatten the unevenness in at least the display area E of the surface of the first sealing film 41.

The buffer layer 42 is an organic resin layer which is formed by coating and drying a solution, which is dissolved by using, for example, an organic resin having transparency as a solvent, with a printing method or a spin coat method. It is possible to exemplify an epoxy resin or the like as the organic resin. Since the unevenness of the surface of the first sealing film 41 is smoothened or the first sealing film 41 is flattened while covering the foreign substance adhered to the first sealing film 41, it is preferable that the thickness of the first sealing film 41 be 1 μm to 5 μm. In the embodiment, the buffer layer 42 is formed to have a thickness of approximately 3 μm using an epoxy resin. Here, in planar view, the buffer layer 42 is formed to cover at least the functional layer 32, and it is preferable that the buffet layer 42 be formed to cover the counter electrode 33. Since the buffer layer 42 is formed to cover at least the functional layer 32, it is possible to smoothen the unevenness at the end part of the functional layer 32. In addition, the buffer layer 42 may cover at least a part of the side of the display area E of the peripheral circuit (the scan line drive circuit 102 in FIG. 4).

Subsequently, the second sealing film 43 is formed to cover the buffer layer 42. Similar to the first sealing film 41, the second sealing film 43 has transparency and gas barrier properties, and is formed using an inorganic compound which has excellent water resistance and thermal resistance. Silicon oxide, silicon nitride, or silicon oxide nitride may be exemplified as the inorganic compound. It is possible to form the second sealing film 43 using the same method as the first sealing film 41. When the second sealing film 43 is formed, it is preferable that the thickness of the second sealing film 43 be formed in the range of 200 nm to 700 nm such that cracks are not generated, and it is further preferable that the thickness of the second sealing film 43 be formed in the range of 300 nm to 400 nm. Therefore, the sealing layer 40, in which the first sealing film 41 and the second sealing film 43 are laminated while interposing the buffer layer 42 therebetween, is completed in at least the display area E. Here, if the buffer layer 42 is formed to cover the counter electrode 33, it is possible to cover the end part of the counter electrode 33 (including a part which overlaps with the cathode wiring 36) by the first sealing film 41 and the second sealing film 43 which is directly laminated on the first sealing film 41.

Subsequently, the color filter 50 is formed on the sealing layer 40. The color filter 50 includes filter layers 50B, 50G, and 50R corresponding to the light emitting pixels 20B, 20G, and 20R. Each of the filter layers 50B, 50G, and 50R is formed by exposing and developing a photosensitive resin layer obtained by coating and drying a solution which includes a photosensitive resin material in which, for example, color materials, such as dyes or pigments, are dissolved or dispersed. Therefore, when three-colored filter layers 50B, 50G, and 50R are formed, at least 3 times of exposure and development are performed. The filter layers 50B, 50G, and 50R are shown such that the thickness thereof is the same in FIG. 4. However, when light emitted from the organic EL element 30 actually penetrates through each of the filter layers 50B, 50G, and 50R, the thickness of each of the filter layers 50B, 50G, and 50R is adjusted in the range of 1.0 m to 2.0 μm such that optical properties, such as appropriate chromaticity and white balance, can be obtained.

In addition, the filter layers 50B, 50G, and 50R are exposed and developed such that the filter layers 50B, 50G, and 50R respectively overlap with the corresponding pixel electrodes 31B, 31G, and 31R in planar view. Further, a boundary between adjacent filter layers may be positioned between the pixel electrodes and the filter layers may be exposed and developed such that one-side filter layer overlaps with a part of the other-side filter layer.

In the embodiment, a configuration is made such that, when light which is emitted from the organic EL element 30 penetrates through the color filter 50, a desired luminescence color can be obtained for each of the light emitting pixels 20B, 20G, and 20R. In addition, an optical, resonance structure is constructed between the power line 14, which functions as the reflection layer, and the counter electrode 33 for each of the light emitting pixels 20B, 20G, and 20R, and light emission, in which luminance is emphasized in a resonant wavelength corresponding to each of the luminescence colors B, G, and R, is obtained.

The resonant wavelengths for the respective light emitting pixels 20B, 20G, and 20R are determined based on an optical distance (referred to as an optical path length) between the power line 14, which functions as the reflection layer, and the counter electrode 33.

The optical path lengths for the respective light emitting pixels 20B, 20G, and 20R are larger in order of B, G, and R, and are adjusted by causing the thickness of the insulation film 28 which is arranged between the power line 14 and the pixel electrode 31 to be different. More specifically, the first insulation film 25 is present between the power line 14 and the pixel electrode 31B, the first insulation film 25 and the second insulation film 26 are present between the power line 14 and the pixel electrode 31G, and the first insulation film 25, the second insulation film 26, and the third insulation film 27 are present between the power line 14 and the pixel electrode 31R. Therefore, the optical distances are different for the respective light emitting pixels 20B, 20G, and 20R. It is possible to display the optical distance of the part of the insulation film 28 by the product of the thickness (t) and the refractive index (n) of the insulation film through which light penetrates. Meanwhile, the refractive index of a layer through which light penetrates depends on the wavelength of penetrating light.

Subsequently, the guard line 105 will be described. As described above, a plurality of wiring layers are provided on the base material 10s. The plurality of transistors 21, 22, and 23 and the storage capacitor 24 which constitute the pixel circuit of the light emitting pixel 20, and the wiring which is connected thereto are divided into the plurality of wiring layers and formed. Hereinafter, with regard to the plurality of respective wiring layers, a wiring layer provided with the gate electrode 22g is called a first wiring layer, a wiring layer provided with a wiring which is connected to the gate electrode 22g is called a second wiring layer, a wiring layer provided with the pair of electrodes 24a and 24b and the data line 12 is called a third wiring layer, and a wiring layer provided with the power line 14 is called a fourth wiring layer.

The guard line 105 in the embodiment is formed in a frame shape along the periphery of the element substrate 10 (base material 10s) in planar view as shown in FIG. 1. On the other hand, as shown in FIG. 4, the guard line 105 includes a wiring 105a which is provided on the second wiring layer, a wiring 105b which is provided on the third wiring layer, a wiring 105c which is provided on the fourth wiring layer, and a wiring 105d which is provided on the insulation film 28. The guard line 105 is formed in a frame shape in wiring layers corresponding to the respective wirings 105a, 105b, 105c, and 105d.

The wiring 105a is formed using a metallic material, for example, Al (aluminum) or the like. The wiring 105b is formed using a metallic compound, for example, TiN (titanium nitride) or the like, as the same as the one-side electrode 24a of the storage capacitor 24. The wiring 105c is formed using the same material as the power line 14. The wiring 105d which is provided on the insulation film 28 is formed using, for example, a metallic material, such as Al (aluminum), and is coated by a protective film 105e which is formed using the same transparent conductive film as the pixel electrode 31 such that the surface thereof is not oxidized.

In addition, the guard line 105 includes a contact part 105f which electrically connects the wiring 105a and the ion implantation part 10d of the base material 10s, a contact part 105g which electrically connects the wiring 105a and the wiring 105b, a contact part 105h which electrically connects the wiring 105b and the wiring 105c, and a contact part 105i which electrically connects the wiring 105c and the wiring 105d. That is, the guard line 105 is electrically connected to the base material 10s which is the semiconductor substrate. Meanwhile, it is preferable that each of the contact parts 105f, 105g, 105h, and 105i be formed in a frame shape along the periphery of the element substrate 10 (base material 10s) in planar view, similar to the wiring 105a, 105b, 105c, and 105d.

The width of the guard line 105, more specifically, the width of the wiring 105d located in a position which is farthest from the base material 10s is approximately 20 μm to 50 μm.

FIG. 5 is a schematic cross-sectional view illustrating the structures of the guard line 105 on the first edge part side provided with the external connection terminal 103 and the light emitting pixel 20G in the organic EL apparatus 100.

Here, the structure of the light emitting pixel 20G will be described with reference to FIG. 5. In the light emitting pixel 20G which includes the optical resonance structure, the first insulation film 25 and the second insulation film 26 are arranged between the power line 14, which functions as the reflection layer, and the pixel electrode 31G. The pixel electrode 31G fills the opening 27a which is formed in the third insulation film 27, and is patterned such that a part of the pixel electrode 31G overlaps with the wiring 106 provided in the contact part 31Gc. The wiring 106 is connected to the source electrode 23s of the third transistor 23 by a contact part which is provided to penetrate through the insulation film 28, the third interlayer insulation film 17, the second interlayer insulation film 16, and the first interlayer insulation film 15 of the lower layer. The gate electrode 23g of the third transistor 23 is connected to the lighting control line 13, which is formed on the first interlayer insulation film 15, by a contact hole which penetrates through the first interlayer insulation film 15.

Electrical connection with the source electrode 23s of the third transistor 23 which corresponds to each of the pixel electrodes 31B and 31R of the light emitting pixels 20B and 20R is performed through the contact part 31Bc and the contact part 31Rc, similar to the light emitting pixel 20G.

The second transistor 22 and the third transistor 23 which are provided in the base material 10s share a drain (ion implantation part 10d) with each other. In addition, the source of the second transistor 22 is connected to the power line 14 by the contact part which is provided to penetrate through the third interlayer insulation film 17, the second interlayer insulation film 16, and the first interlayer insulation film 15.

The buffer layer 42 of the sealing layer 40 which seals the organic EL element 30 of the light emitting pixel 20G is provided to cover the display area E and the cathode wiring 36 in planar view. In the other areas throughout the end surface 10e of the element substrate 10, the first sealing film 41 and the second sealing film 43 are laminated while the first sealing film 41 comes into contact with the second sealing film 43. In the first edge part side of the element substrate 10, an opening 45 which penetrates through the first sealing film 41 and the second sealing film 43 is provided, and the external connection terminal 103 is positioned in the opening 45. Meanwhile, the buffer layer 42 may cover at least a part of the side of the display area E of the peripheral circuit (the data line drive circuit 101 in FIG. 5).

Since the external connection terminal 103 is designed for the electrical connection with the peripheral circuit, the external connection terminal 103 is configured to include, for example, a wiring 103a provided in the second wiring layer, a wiring 103b provided in the third wiring layer, a wiring 103c provided in the fourth wiring layer, a wiring 103d provided on the insulation film 28, and a contact part which electrically connects the wirings in the plurality of wiring layers on the base material 10s. The wiring 103d is formed using, for example, a metallic material, such as Al, and includes a protective film 103e which protects the surface thereof. The same transparent conductive film as the pixel electrode 31 is used as the protective film 103e. That is, the wiring 103d is formed in the same layer as the wiring 105d of the guard line 105 (refer to FIG. 4), and is coated by the same transparent conductive film as the pixel electrode 31.

The guard line 105 on the side of the first edge part is configured to include the wirings 105a, 105b, and 105c and contact parts 105f, 105g, and 105h which electrically connect the wirings 105a, 105b, and 105c. That is, the guard line 105 in the edge part other than the first edge part (refer to FIG. 4) does not include the wiring 105d and the contact part 105i. If, when thermo-compression is performed on a Flexible Printed Circuit (FPC) and the FPC is mounted on the external connection terminal 103 using, for example, an anisotropic conductive film (ACF), the first sealing film 41 and the second sealing film 43 are destroyed by conductive particles included in the ACF, there is a problem in that the external connection terminals 103 and the guard line 105 are electrically short-circuited. Here, on the side of the first edge part, the wiring 105d, which is positioned at the same layer as the wiring 103d of the external connection terminal 103, and the contact part 105i, which is connected to the wiring 105d, are excluded from the guard line 105.

As above, the guard line 105 is provided to include the plurality of wirings which are provided on the plurality of wiring layers and the insulation film 28 on the base material 10s and the contact parts which connect the plurality of wirings to each other. Therefore, it is possible to suppress moisture or oxygen from entering inside from the end surface 10e of the element substrate 10, particularly, between the wiring interlayer and the insulation film.

From the viewpoint that the moisture, oxygen or the like which enters from the end surface 10e does not affect the organic EL element 30, it is preferable that the guard line 105 include the wirings 105c and 105d which are provided on two wiring layers on the close side to the organic EL element 30 formed on the base material 10s, and the contact part 105i which connects the wirings 105c and 105d to each other. In addition, as described above, it is preferable that each of the contact parts 105f, 105g, 105h, and 105i be provided in a frame shape the same as each of the wirings 105a, 105b, 105c, and 105d in order to prevent moisture, oxygen, or the like from entering inside.

A predetermined potential is supplied to the guard line 105 which is electrically connected to the base material 10s when the organic EL apparatus 100 is driven. The predetermined potential is a reference potential Vss which is supplied from, for example, the external circuit through the external connection terminals 103. If any one of the wirings 105a, 105b, 105c, and 105d is electrically connected to the external connection terminal 103, it is possible to supply the reference potential Vss to the guard line 105. In addition, it is possible to supply the reference potential Vss from the data line drive circuit 101 and the scan line drive circuit 102, to which the reference potential Vss is supplied, through any one of the wirings 105a, 105b, 105c, and 105d.

If the reference potential Vss is supplied to the guard line 105, it is possible to prevent noise from being propagated to the base material 10s which is the semiconductor substrate from the outside, and to prevent malfunctions from occurring in the pixel circuit and the peripheral circuit. That is, the guard line 105 performs a function as an electrical shield in addition to the sealing function of preventing moisture, oxygen, or the like from entering.

The element substrate 10, which includes the pixel circuit, the organic EL element 30, the sealing layer 40, the color filter 50, and the guard line 105 that are formed on the base material 10s, is adhered to the sealing substrate 70 through the resin layer 60 which has adhesiveness and transparency. For example, it is possible to use a thermosetting type or photo-curing type epoxy resin material or the like as the resin layer 60. After the resin material is coated in the element substrate 10, the sealing substrate 70 is pressed to the element substrate 10, and the resin material is stretched and extended in a predetermined range and cured.

Method of Manufacturing Electro-Optic Apparatus

Figure 6A:
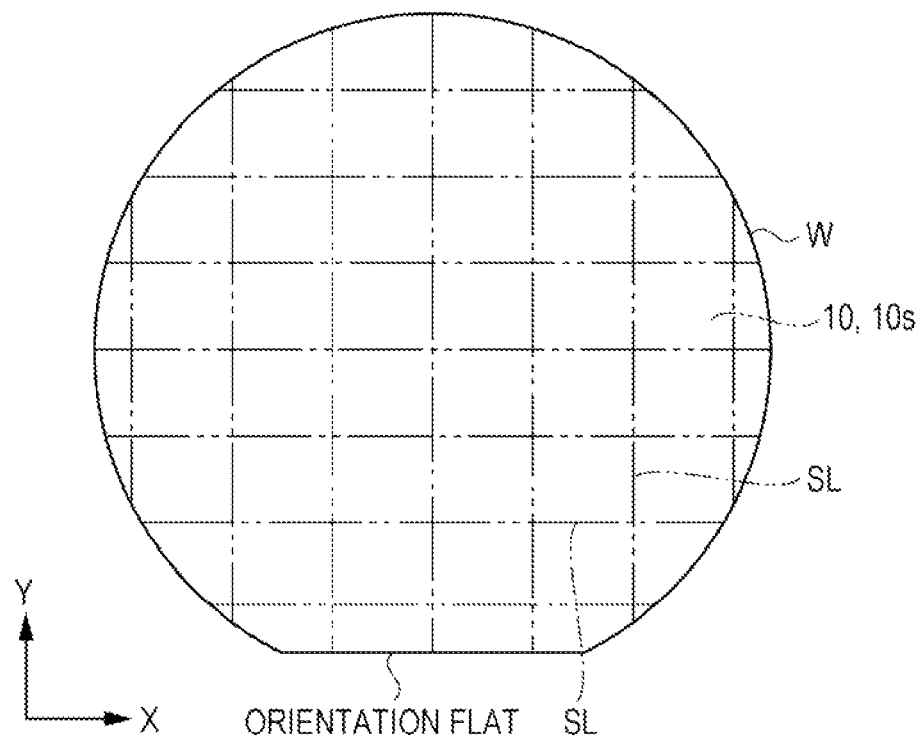
FIG. 6A is a schematic plan view illustrating a mother substrate.

Subsequently, a method of manufacturing the organic EL apparatus 100 as the electro-optic apparatus according to the embodiment will be described with reference to FIGS. 6A and 6B. FIG. 6A is a schematic plan view illustrating a mother substrate, and FIG. 6B is a schematic plan view illustrating the arrangement of an element substrate in the mother substrate.

As described above, the element substrate 10 of the organic EL apparatus 100 according to the embodiment uses the semiconductor substrate as the base material 10s. When the organic EL apparatus 100 is actually manufactured, a mother substrate W shown in FIG. 6A is used. The mother substrate W is, for example, a silicon wafer. On the mother substrate W, a plurality of element substrates 10 (base material. 10s) are laid out (printed) in a matrix shape, and the transistors 21, 22, and 23, the storage capacitor 24, the various wirings, the guard line 105, the organic EL element 30, the sealing layer 40, and the color filter 50, which constitute the above-described pixel circuit, are formed. For example, the size of the mother substrate W is a diameter of $\phi$25 cm, and a diagonal length of the element substrate 10 is approximately 14 mm or less. That is, the organic EL apparatus 100 is a small-sized spontaneous light emitting display device. The mother substrate W is provided with an orientation flat which is a design criteria when the element substrate 10 is laid out.

In the method of manufacturing the organic EL apparatus 100 according to the embodiment, the guard line 105 is formed in a frame shape so as to surround the display area E in which the organic EL element 30 is provided, the peripheral circuits (data line drive circuit 101 and the scan line drive circuit 102), and the plurality of external connection terminals 103. That is, each of the wirings 105a, 105b, 105c, and 105d which constitute the guard line 105 is formed in a frame shape in each of the wiring layers.

Figure 6B:
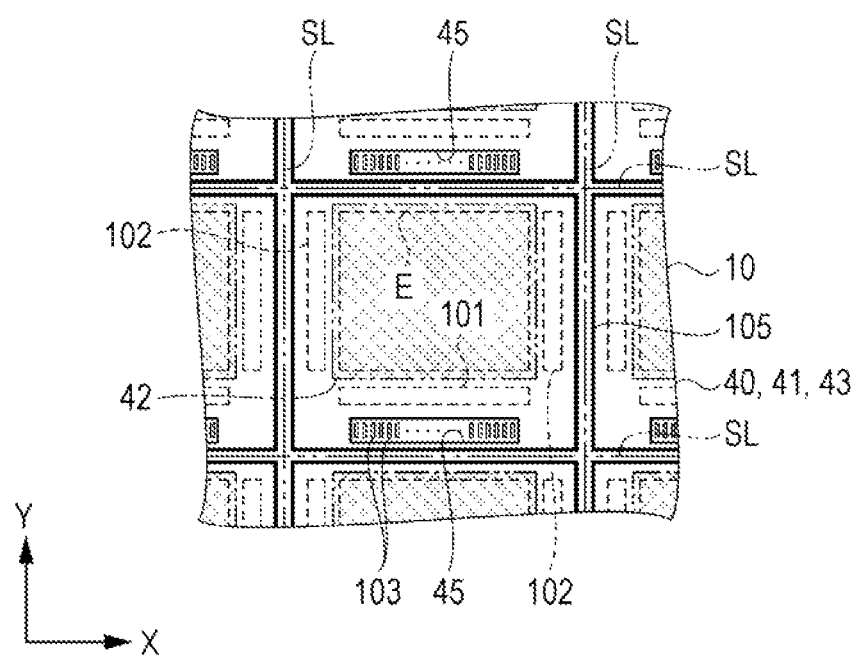
FIG. 6B is a schematic plan view illustrating the arrangement of an element substrate in the mother substrate.

As shown in FIG. 6B, the first sealing film 41 of the sealing layer 40 is formed throughout the entire mother substrate W. The buffer layer 42 is formed to cover at least the display area E for each individual element substrate 10 which is laid out on the mother substrate W. Further, the second sealing film 43 is formed to cover the buffer layer 42 throughout the entire mother substrate W as the same as the first sealing film 41. Further, in order to expose the plurality of external connection terminals 103, the opening 45 which penetrates through the first sealing film 41 and the second sealing film 43 is etched and formed as described above.

As described above, a method of forming the color filter 50 on the sealing layer 40 is performed by repeating a process to expose and develop the photosensitive resin layer at least three times in correspondence to the B, G, and R colors of the filter.

Further, a resin material acquired when the resin layer 60 is configured is coated on an individual element substrate 10, on which the color filter 50 is formed, using a printing method, and the diced sealing substrate 70 is adhered to the individual element substrate 10, thereby hardening the resin layer 60. Therefore, the organic EL apparatus 100 is completed in a state in which the organic EL apparatus 100 is laid out on the mother substrate W.

Subsequently, as shown in FIGS. 6A and 6B, the mother substrate W is cut along virtual scission lines SL and the individual organic EL apparatus 100 is produced. It is possible to use a dicing method, a laser cutting method, a scoring scribing method, or the like as a method of cutting the mother substrate W.

Meanwhile, a method of attaching the sealing substrate 70 to the element substrate 10 through the resin layer 60 is not limited to a method of using the diced sealing substrate 70. For example, an individual organic EL apparatus 100 may be produced in such a way that a transparent glass substrate which has substantially the same shape and size as the mother substrate W is adhered to the mother substrate W and then the glass substrate and the mother substrate W are cut.

According to the first embodiment, the following advantages are obtained.

(1) According to the organic EL apparatus 100 and the method of manufacturing the same, the guard line 105 is arranged in a frame shape along the periphery of the element substrate 10, and is formed to surround the area in which the display area E and the peripheral circuit are provided in planar view. The first sealing film 41 and the second sealing film 43 are formed to cover the guard line 105 in planar view. In addition, the guard line 105 includes the wirings 105a, 105b, 105c, and 105d and the contact parts 105f, 105g, 105h, and 105i, which are formed in frame shapes in the plurality of wiring layers of the element substrate 10. Therefore, it is possible to prevent moisture, oxygen, or the like from entering the display area E from the end surface 10e of the element substrate 10. The plurality of light emitting pixels 20, which include the organic EL element 30, are arranged in the display area E, and it is possible to prevent the light emitting function of the organic EL element 30 from being deteriorated or lost due to the influence of moisture, oxygen, or the like in such a way as to provide the guard line 105 in addition to the sealing layer 40 which covers the display area E. That is, it is possible to provide or manufacture the organic EL apparatus 100 which has excellent reliability and quality for the light emitting function.

In addition, the sealing substrate 70 is arranged to cover the sealing layer 40 and the guard line 105 in planar view excepting the first edge part of the element substrate 10, and it is possible to prevent the light emitting function of the organic EL element 30 from being deteriorated or lost due to the influence of moisture, oxygen, or the like.

(2) The guard line 105 includes the contact parts 105f, 105g, 105h, and 105i that electrically connect the wirings 105a, 105b, 105c, and 105d to each other, and electrically connect the wirings to the base material 10s which is a semiconductor substrate. Further, the reference potential Vss is supplied to the guard line 105 through any of the wirings 105a, 105b, 105c, and 105d. Therefore, in addition to performing the sealing function for moisture, oxygen, or the like, it is possible to prevent noise from being propagated to the inside of the base material 10s from the outside and to prevent malfunctions from occurring in the pixel circuit and the peripheral circuit.

Second Embodiment

Figure 7:
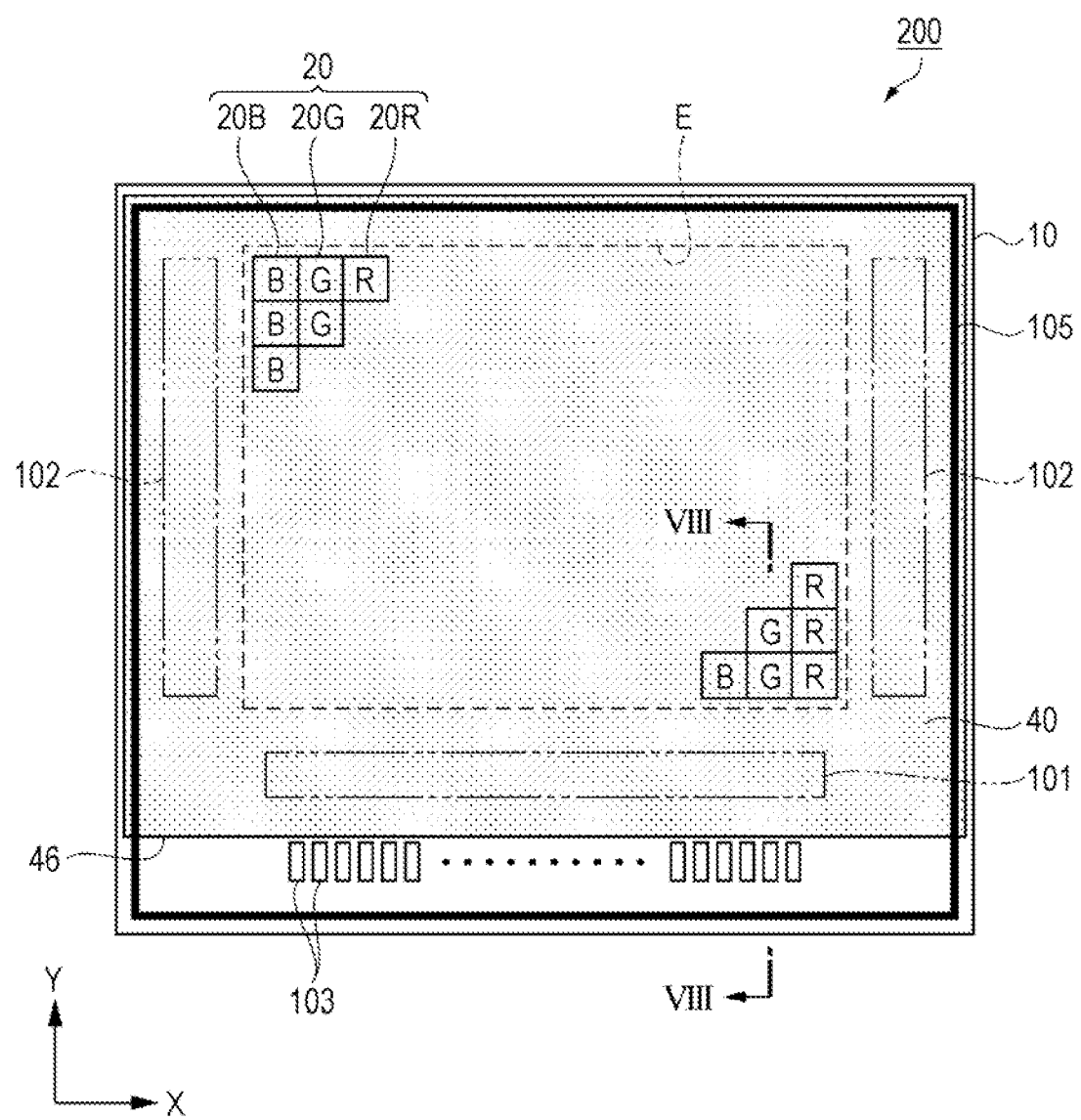
FIG. 7 is a schematic plan view illustrating the configuration of an organic EL apparatus as an electro-optic apparatus according to a second embodiment.
Figure 8:
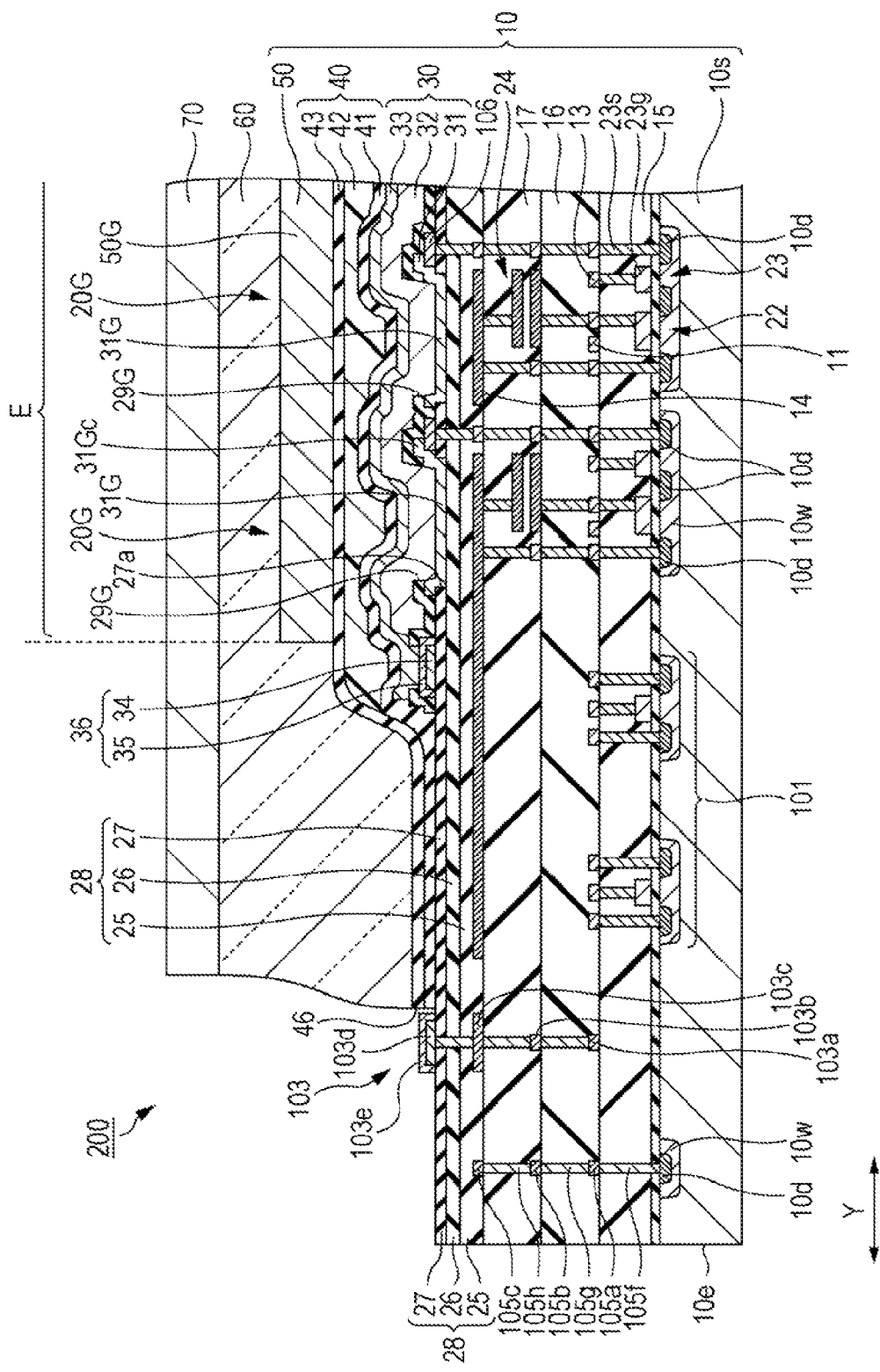
FIG. 8 is a schematic cross-sectional view taken along a line VIII-VIII in FIG. 7.

Subsequently, an electro-optic apparatus according to a second embodiment will be described with reference to FIGS. 7 and 8. FIG. 7 is a schematic plan view illustrating the configuration of an organic EL apparatus as the electro-optic apparatus according to the second embodiment, and FIG. 8 is a schematic cross-sectional view taken along a line VIII-VIII in FIG. 7.

The organic EL apparatus according to the second embodiment has a different range in which the sealing layer 40 is formed, compared to the organic ML apparatus 100 according to the first embodiment. Therefore, the same reference numerals denote the same configurations as in the first embodiment, and the detailed description thereof will not be repeated.

As shown in FIG. 7, an organic EL apparatus 200 according to the embodiment includes an element substrate 10, a plurality of light emitting pixels 20 (20B, 20G, and 20R) which are provided in a display area E on the element substrate 10, and a data line drive circuit 101, a pair of scan line drive circuits 102 and a plurality of external connection terminals 103 which are provided in the periphery of the display area E. In addition, the an organic EL apparatus 200 further includes a guard line 105 which is arranged in a frame shape along the periphery of the element substrate 10, and surround an area in which the display area E and peripheral circuits (the data line drive circuit 101 and the scan line drive circuit 102) are provided in planar view. In addition, the organic EL apparatus 200 further includes a sealing layer 40 which covers at least the display area E in planar view.

The sealing layer 40 is formed to overlap with the external connection terminals 103 on the side of a first edge part of the element substrate 10 in which the external connection terminals 103 are provided. In other edge parts excepting the first edge part of the element substrate 10, the sealing layer 40 is formed to reach the guard line 105 in planar view.

The sealing layer 40 includes a first sealing film 41 which covers a counter electrode 33, a buffer layer 42, and a second sealing film 43 which covers the buffer layer 42. In the first embodiment, the first sealing film 41 and the second sealing film 43 which are inorganic sealing films are formed through the entire surface of the mother substrate W. Therefore, in order to expose the external connection terminals 103, it is necessary to partially remove (for example, etch) the first sealing film 41 and the second sealing film 43. In contrast, in the second embodiment, as shown in FIG. 8, the end part 46 of the sealing layer 40 on the side of the first edge part (the end part of the first sealing film 41 and the second sealing film 43) is selectively formed so as not to reach the external connection terminals 103. Therefore, unlike the first embodiment, it is not necessary to form the openings 45 in order to expose the plurality of external connection terminals 103, and thus it is possible to simplify a manufacturing process.

In other words, if the sealing layer 40 is formed to reach the guard line 105 on the side of at least one edge part of the element substrate 10 in planar view, the sealing function with regard to the organic EL element 30 is improved compared to a case in which the guard line 105 is not present. The sealing layer 40 may be formed to reach each edge of the guard line 105 which has the frame shape as in the first embodiment, and the sealing layer 40 may be formed to reach a remaining third edge of the guard line 105 excepting the first edge part in which the external connection terminals 103 of the element substrate 10 are provided as in the second embodiment.

Third Embodiment

Figure 9:
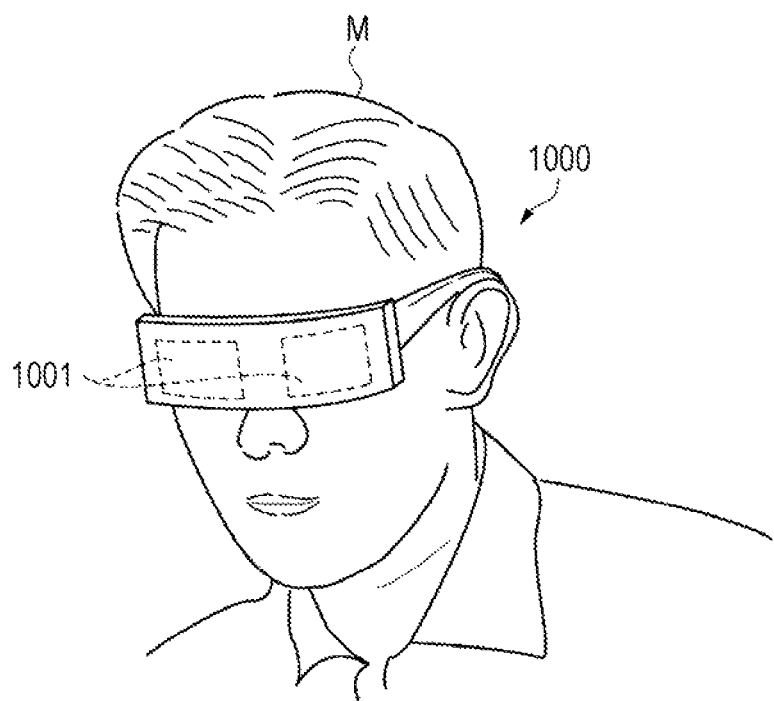
FIG. 9 is a schematic view illustrating a head-mounted display as an example of an electronic apparatus.

Subsequently, an electronic apparatus according to a third embodiment will be described with reference to FIG. 9. FIG. 9 is a schematic view illustrating a head-mounted display as an example of the electronic apparatus.

As shown in FIG. 9, a Head-Mounted Display (HMD) 1000 as the electronic apparatus according to the embodiment includes two display units 1001 which are provided to correspond to right and left eyes. When an observer M puts the head-mounted display 1000 on the head like glasses, it is possible to see letters, images, or the like which are displayed on the display units 1001. For example, if images are displayed on the right and left display units 1001 by taking a parallax into consideration, it is possible to see and enjoy three-dimensional images.

In the display units 1001, the organic EL apparatus 100 which is the spontaneous light emitting display apparatus according to the first embodiment (or the organic EL apparatus 200 according to the second embodiment) is mounted. Therefore, it is possible to provide a light-weight head-mounted display 1000 which has high reliability and quality in the light emitting function.

The head-mounted display 1000 is not limited to a configuration in which the observer M directly sees the displayed content of the display units 1001, and may have a configuration in which the observer M indirectly sees the displayed content using a mirror or the like.

In addition, the head-mounted display 1000 is not limited to the two display units 1001, and may have a configuration which includes one display unit 1001 corresponding to any one of the right and left eyes.

Meanwhile, the electronic apparatus which is mounted on the organic EL apparatus 100 or the organic EL apparatus 200 is not limited to the head-mounted display 1000. For example, an electronic apparatus which includes a display unit, such as a head-up display, the Electronic View Finder (EVF) of a digital camera, a portable information terminal, or a navigator, may be exemplified. In addition, the invention is not limited to the display unit, and the invention can be applied to a lighting apparatus or an exposure apparatus.

The invention is not limited to the above embodiments, and can be appropriately changed in a range without departing from the gist or spirit of the invention implied from claims or the entire specification. In addition, an electro-optic apparatus which involves such a change, a method of manufacturing the electro-optic apparatus, and an electronic apparatus to which the electro-optic apparatus is applied are included in the technical range of the invention. In addition to the embodiments, various modification examples may be conceivable. Hereinafter, modification examples will be described.

First Modification Example

Figure 10:
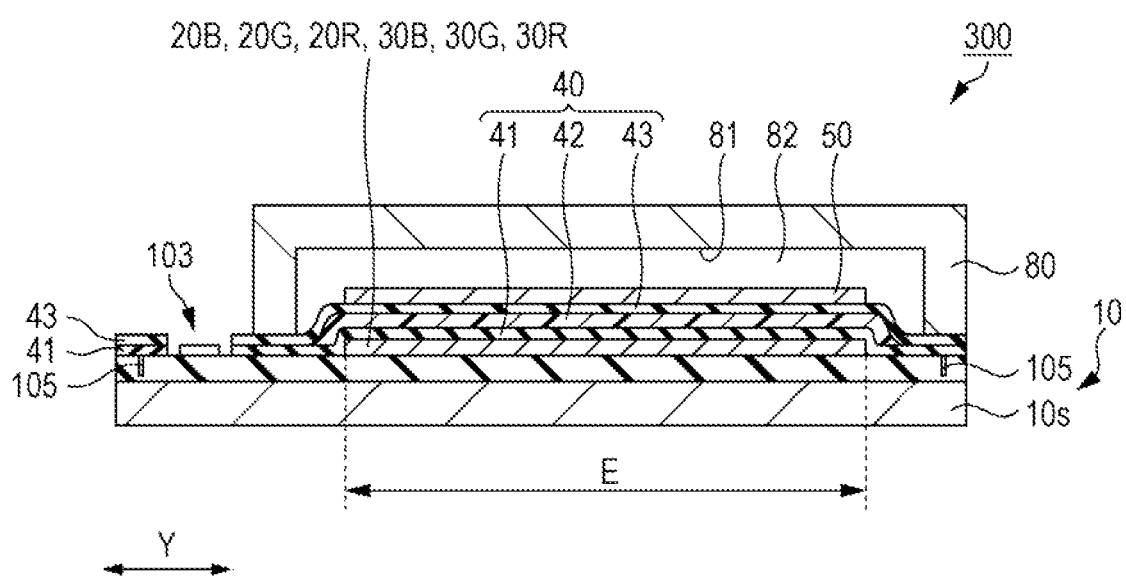
FIG. 10 is a schematic cross-sectional view illustrating a sealing structure in an organic EL apparatus according to a modification example.

A sealing structure which seals the light emitting pixels 20 is not limited to the structure in which the sealing substrate 70 is adhered to the element substrate 10 through the resin layer 60. FIG. 10 is a schematic cross-sectional view illustrating the sealing structure of an organic EL apparatus according to a modification example. Meanwhile, the same reference numerals are used to indicate the same components of the organic EL apparatus 100 according to the first embodiment.

For example, as shown in FIG. 10, an organic EL apparatus 300 according to the modification example includes an element substrate 10, organic EL elements 30B, 30G, and 30R which are provided for respective light emitting pixels 20B, 20G, and 20R in the display area E of the element substrate 10, a sealing layer 40 which seals the organic EL elements 30B, 30G, and 30R, a color filter 50 which is provided on the sealing layer 40, an external connection terminal 103, a guard line 105, and a sealing member 80. The sealing member 80 uses, for example, a glass substrate, a plastic substrate, or the like which has transparency, and includes a depression 81 which is formed on one side thereof. The depression 81 is formed to have a size capable of covering an area in which the buffer layer 42 of the sealing layer 40 is formed. The sealing member 80 is adhered or bonded to the element substrate 10 under decompression. Therefore, the external connection terminal 103 is exposed on the element substrate 10 and a decompressed space 82 is present between the color filter 50 and the sealing member 80. An adhesion member which adsorbs gas, such as moisture or oxygen, may be built in the space 82. Such a sealing structure is called can sealing. The sealing member 80 is adhered or bonded to the element substrate 10 so as to overlap with the guard line 105 in planar view in a third edge part excepting the side of the first edge part of the element substrate 10 in which the external connection terminal 103 is provided. That is, even when the guard line 105 according to the embodiment is applied to the organic EL apparatus 300 which has a can sealing structure, it is possible to improve the sealing function.

Second Modification Example

Figure 11A:
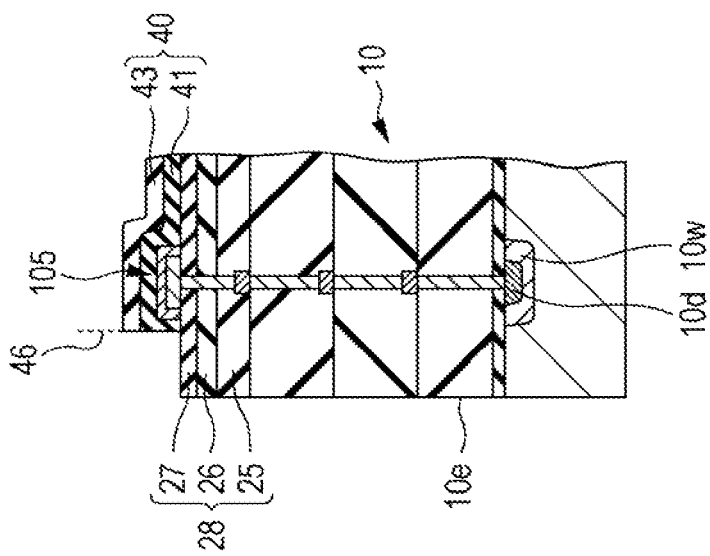
FIGS. 11A to 11C are schematic cross-sectional views illustrating the sealing structure according to the modification example.
Figure 11B:
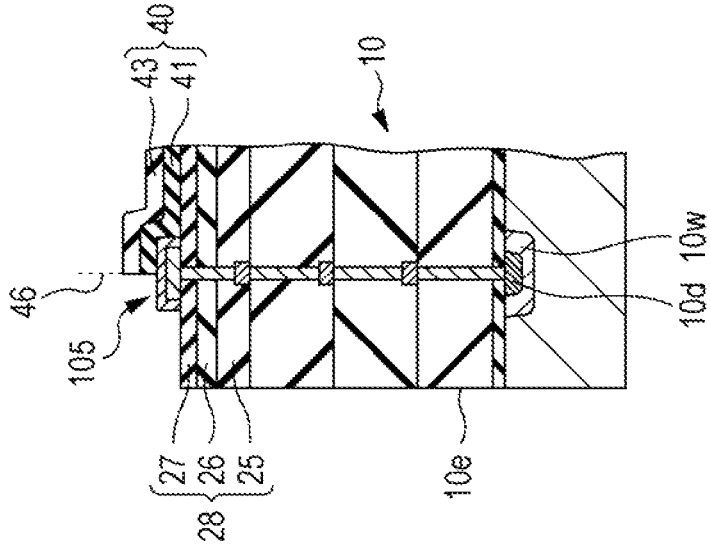
Figure 11C:
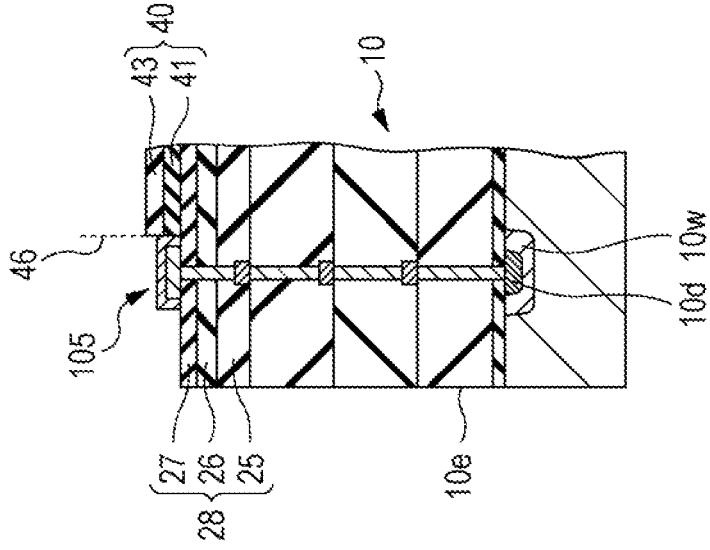

The sealing layer 40 which is formed to reach the guard line 105 in planar view is not limited to the sealing layer 40 which is formed to cover the guard line 105 as in the first embodiment. FIGS. 11A to 11C are schematic cross-sectional views illustrating a sealing structure according to the modification example. For example, as shown in FIG. 11A, the sealing layer 40 may be formed such that the end part 46 of the sealing layer 40 reaches the edge part of the guard line 105. In addition, as shown in FIG. 11B, the sealing layer 40 may be formed such that the sealing layer 40 overlaps with a part of the guard line 105. Further, as shown in FIG. 11C, the sealing layer 40 may be formed to cover the guard line 105 in a position which does not reach the end surface 10e of the element substrate 10. As shown in FIGS. 11A to 11C, the sealing layer 40 is formed such that the end part 46 is located in a position which is separated from the end surface 10e of the element substrate 10, that is, the cut surface (end surface 10e) acquired when the element substrate 10 is cut from the mother substrate W, with the result that an insulation film 28 is present in a portion along a scission line, and thus it is possible to prevent the sealing layer 40 from being damaged when the mother substrate W is cut.

Third Modification Example

In the organic EL apparatus 100 or the organic EL apparatus 200, the configurations of the light emitting pixels 20B, 20G, and 20R are not limited thereto. For example, the color filter 50 is not limited to a color filter which is formed on the side of the element substrate 10, and may be formed on the side of the sealing substrate 70. Further, the color filter 50 is not essential, and a configuration in which light emission of a desired color can be obtained from the organic EL element 30 in each of the light emitting pixels 20B, 20G, and 20R may be used.

In addition, for example, a method of causing the optical distance (optical path length) to be different in the optical resonance structure for each of the light emitting pixels 20B, 20G, and 20R is not limited to a method of causing substantial thickness of the insulation film 28 between the power line 14 and the pixel electrodes 31B, 31G, and 31R to be different, and the thickness of the pixel electrodes 31B, 31G, and 31R may be caused to be different. Further, the light emitting pixels 20B, 20G, and 20R may not include the respective optical resonance structure.

Fourth Modification Example

An electro-optic apparatus to which the guard line 105 is applied is not limited to the top emission-type organic EL apparatus 100 or the organic EL apparatus 200, and may be a bottom emission-type organic EL apparatus. In a case of the bottom emission-type organic EL apparatus, a member which has optical transparency is selected as the base material 10s of the element substrate 10.

Fifth Modification Example

In the first embodiment and the second embodiment, the guard line 105 is not limited to a guard line which is formed in a frame shape (ring shape) in the same wiring layer. If the guard line can surround an area which is arranged along the periphery of the element substrate 10 and includes the display area E, the peripheral circuit, and the external connection terminals 103, the operation and the advantage of the invention can be acquired even in, for example, a state in which a part of the guard line is obstructed.

The entire disclosure of Japanese Patent Application No. 2013-118566, filed Jun. 5, 2013 is expressly incorporated by reference herein.

What is claimed is:
1. An electro-optic apparatus comprising:
a substrate that includes a first edge provided with connection terminals;
a light-emitting element that is provided at a first area of the substrate;
a guard line that is provided to surround the first area;
a plurality of wiring layers that are provided above the substrate, the guard line including wirings and contact parts that are respectively provided in a frame shape on at least two wiring layers of the plurality of wiring layers;
a sealing film that is directly formed on a cathode of the light-emitting element and covers the first area and reaches the guard line in edges except for the first edge, the sealing film being a transparent sealing film;
a color filter disposed on the sealing film; and
a resin layer that is directly formed on the color filter in the first area, and on the sealing film in an area between the first area and the guard line, and reaches the guard line.

2. The electro-optic apparatus according to claim 1, wherein the sealing film is provided to reach the guard line in at least one edge of the substrate.
3. The electro-optic apparatus according to claim 1, wherein the substrate is a semiconductor substrate, and wherein the guard line is electrically connected to the semiconductor substrate.
4. The electro-optic apparatus according to claim 3, wherein a predetermined potential is supplied to the guard line.
5. The electro-optic apparatus according to claim 1, wherein the light-emitting element is an organic electroluminescence element.
6. An electronic apparatus which includes the electro-optic apparatus according to claim 1.
7. An electronic apparatus which includes the electro-optic apparatus according to claim 2.
8. An electronic apparatus which includes the electro-optic apparatus according to claim 3.
9. An electronic apparatus which includes the electro-optic apparatus according to claim 4.
10. The electro-optic apparatus according to claim 1, wherein the sealing film includes a first sealing film and a second sealing film.
11. The electro-optic apparatus according to claim 10, wherein the thickness of the first sealing film is 200 nm to 400 nm.
12. The electro-optic apparatus according to claim 10, wherein the thickness of the second sealing film is 200 nm to 700 nm.
13. The electro-optic apparatus according to claim 10, wherein the second sealing film includes at one of silicon oxide, silicon nitride, silicon oxide nitride, or titanium nitride.
14. An electronic apparatus which includes the electro-optic apparatus according to claim 10.
15. An electronic apparatus which includes the electro-optic apparatus according to claim 11.
16. The electro-optic apparatus according to claim 10, wherein a buffer layer is interposed between the first sealing film and the second sealing film.
17. A method of manufacturing an electro-optic apparatus that includes a substrate that includes a first edge provided with connection terminals, a light-emitting element which is provided at a first area of the substrate, and a sealing film or a sealing structure which seals the light-emitting element, the method comprising:
forming a guard line so as to surround the first area;
forming a plurality of wiring layers above the substrate, the guard line including wirings and contact parts that are respectively formed in a frame shape on at least two wiring layers of the plurality of wiring layers;
forming the sealing film directly on a cathode of the light-emitting element so as to cover the first area and to reach the guard line in edges except for the first edge, the sealing film being a transparent sealing film;
forming a color filter on the sealing film;
forming a resin layer on the color filter in the first area, and on the sealing film in an area between the first area and the guard line, and reaching the guard line.

* * * * *